United States Patent [19]

Smith

[11] 4,271,516

[45] Jun. 2, 1981

[54] AUTOMATIC TESTING OF ELECTRICAL CIRCUITRY

[75] Inventor: Anthony J. Smith, Penn, England

[73] Assignee: Racal Automation Limited, Berkshire, England

[21] Appl. No.: 69,043

[22] Filed: Aug. 23, 1979

[30] Foreign Application Priority Data

Aug. 25, 1978 [GB] United Kingdom ............... 34571/78

[51] Int. Cl.³ ...................... G06F 11/00; G01R 15/12
[52] U.S. Cl. .................................... 371/25; 324/73 R
[58] Field of Search .......... 371/25; 324/73 R, 73 AT, 324/73 PC

[56] References Cited

U.S. PATENT DOCUMENTS

| | | | |
|---|---|---|---|
| 3,924,109 | 12/1975 | Jhu et al. ............................... | 371/25 |
| 4,108,358 | 8/1978 | Niemaszyk et al. ......... | 324/73 AT X |
| 4,180,203 | 12/1979 | Masters .......................... | 324/73 R X |

FOREIGN PATENT DOCUMENTS

| | | |
|---|---|---|
| 1198134 | 7/1970 | United Kingdom . |
| 1263644 | 2/1972 | United Kingdom . |
| 1278631 | 6/1972 | United Kingdom . |
| 1295099 | 11/1972 | United Kingdom . |
| 1445470 | 8/1976 | United Kingdom . |
| 1513731 | 6/1978 | United Kingdom . |
| 1528497 | 10/1978 | United Kingdom . |

*Primary Examiner*—David H. Malzahn

[57] ABSTRACT

By means of contact pins fixed on a plate, test signals may be applied to points in a logic circuit to be tested, the signals being applied for such short periods of time as not to damage components in the circuitry. High speed switches can be individually enabled so as to pre-select any particular one or ones of the contact pins, and a pulsed voltage source then momentarily energizes the pre-selected pins. Output signals are read via other switches connected to the contact pins. The high speed switches are electronic. Control means controls the switches in accordance either with pre-programmed information or with information fed in. In the latter case the fed-in information is then automatically transferred to enable it to be used again if that circuit type is tested in the future.

12 Claims, 3 Drawing Figures

AUTOMATIC TESTING OF ELECTRICAL CIRCUITRY

BACKGROUND OF THE INVENTION

The invention relates to methods and apparatus for the automatic testing of electrical and electronic circuitry. More specifically, it may relate to testing such circuitry in integrated form. For example, the methods and apparatus to be more specifically described below can be used for applying test signals to integrated logic circuits and to determine, from the resultant outputs produced by the logic circuits, whether the logic circuits are operating correctly and, if not, which part is faulty.

In practice, logic circuits are normally connected together to form a complete circuit board which performs a specific function or functions, all the logic circuits acting together to perform that function or functions. In order to test such an arrangement, test signals may be applied to the complete circuit board. However, it is in practice also necessary to test each particular logic circuit individually to ensure that it is carrying out correctly its part of the total function. Clearly, it is not practicable to disconnect each logic circuit from the remainder of the circuitry to carry out this test, and therefore each logic circuit must be tested in situ.

An object of the invention, therefore, is to enable circuits which are all electrically connected together to be tested individually while they are still so connected.

A further object of the invention is to enable such testing to be carried out on each such circuit without causing damage to the other circuits to which it is connected.

Another object of the invention is to provide means by which test information, for controlling the testing of any particular circuit, can be stored and retrieved when needed, and if not stored, can be set up, used and then stored for use again in the future.

BRIEF SUMMARY OF THE INVENTION

According to the invention, there is provided apparatus for the automatic testing of electrical and electronic circuitry, comprising a plurality of contact means mounted in predetermined physical relationship with each other for making respective and simultaneous contact with predetermined terminals on a circuit to be tested, a plurality of switching means each connected to a respective one of the contact means and being selectively operable to enable test signals to be applied to at least some predetermined ones of the terminals via the respective contact means and to enable a resultant output signal from at least one predetermined one of the terminals to be picked up by the respective contact means, means for simultaneously applying the test signals to the predetermined ones of the terminals via the selectively operated switching means for a predetermined length of time which is insufficient in relation to the magnitude of the test signals to cause damage to other circuits which may be connected to the terminals of the circuit under test, and means for monitoring the or each resultant output signal to determine whether the circuit under test is operating correctly or not.

According to the invention, there is further provided a method of automatically testing a logic circuit which is interconnected in a circuit arrangement with other logic circuits, comprising the steps of simultaneously applying test signals of predetermined value to preselected ones of the terminals of the logic circuit under test for a predetermined length of time which is insufficient in relation to the values of the test signals to cause damage to the other logic circuits, and monitoring the resultant output signal produced at at least one other of the terminals of the logic circuit in relation to the test signals applied to the logic circuit whereby to assess whether the logic circuit is operated correctly or not.

According to the invention, there is yet further provided apparatus for the automatic testing of electrical and electronic circuitry, comprising: a plurality of contact means mounted in predetermined physical relationship with each other for making respective and simultaneous contact with predetermined terminals of a circuit to be tested; control means operative in response to predetermined test information respective to the circuit to be tested to apply predetermined test signals to selected ones of the predetermined terminals via the respective contact means and to monitor the value of a resultant output signal produced from a selected one of the predetermined terminals via its respective contact means whereby to determine whether the circuit is operating correctly or not; means for storing, for each of a plurality of separately identifiable circuits to be tested, test information defining the predetermined terminals of that circuit to which test signals are to be applied and the resultant output signal which should be produced at one or more predetermined terminals of the circuit if it is operating correctly; input means for identifying a particular circuit to be tested and for feeding the said test information relating to that particular circuit out of the storage means if it stored therein; generating means for generating test information relating to a circuit to be tested for which test information is not stored in the storage means; means for producing connection information correlating the particular predetermined terminals of that circuit with the particular contact means to which those terminals are temporarily connected; programming means responsive to the test information whether from the storage means or the generating means and to the connection information so as to render the control means operative accordingly; and means for feeding into the storage means the test information produced by the generating means and identifying it therein as relating to one particular circuit so as to enable it to be read out when that circuit is next to be tested.

DESCRIPTION OF THE DRAWINGS

Automatic test apparatus embodying the invention, and automatic test methods according to the invention, both for the in-circuit testing of a logic circuit, or other circuit element, while it is interconnected with other logic circuits or circuit elements, will now be described by way of example and with reference to the accompanying diagrammatic drawings in which.

DESCRIPTION OF PREFERRED EMBODIMENTS

The apparatus now to be more specifically described is, in this example, intended for testing the operation of integrated logic circuits and other circuit elements such as resistors and capacitors. For testing a logic circuit, testing is carried out by applying predetermined test signals (such as representing binary levels that may arise in the logic circuit during its normal operation) to the relevant points in the logic circuit, and monitoring the resultant outputs by comparing them against the outputs that should arise if the circuit is operating correctly —so as to indicate a fault (and the position of the fault) if an incorrect, or no, output is produced.

The test signals may be applied to the logic circuit by means, for example, of a contact plate having a plurality of contact pins (which may be spring loaded) which are so physically arranged in relation to each other that, when the contact plate is placed adjacent to the circuit board carrying the logic circuit to be tested and held by a suitable jig, the pins are pressed into firm electrical and mechanical contact with those points in the logic circuit to which test signals are to be applied. This means, of course, that each test signal will not only be applied to the input of the particular logic circuit which it is intended to test, but will also be applied to the output of the immediately preceding part of the total circuit. In order not to cause damage to the electronic components (for example, the transistors) of this preceding part, the test signals are applied for not more than a predetermined length of time (say 10 uS) which is selected so that the electrical heating or any other effect which it causes is not sufficient to result in any damage to those components.

Figure 1:
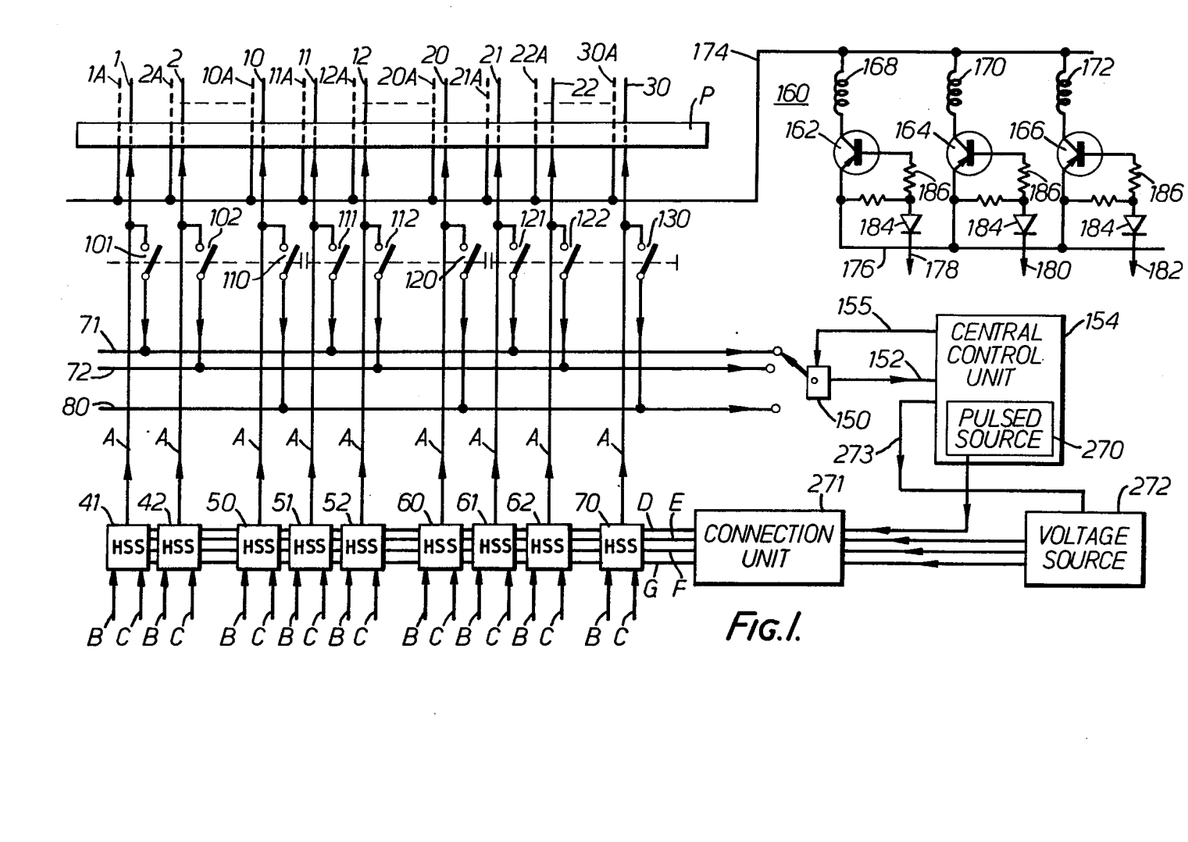
FIG. 1 is a block circuit diagram of part of the apparatus showing circuitry for controlling, driving and and monitoring a set of test pins.

FIG. 1 shows, diagrammatically, the contact plate P from which project thirty (in this example) contact pins which are spring loaded, electrically insulated from each other, and have sharp points so as to make good electrical contact with the respective parts of the circuitry to be tested when the contact plate and the circuit board carrying the circuitry are mounted together in a suitable mounting jig so as to have a predetermined relationship to each other. The pins are numbered 1 to 30. In a manner to be explained, the pins are electrically arranged in three groups of ten, and in order to save space in the Figure, only the first two and the last pins of each such group are shown in the Figure, these pins therefore being numbered 1, 2 and 10, 11, 12 and 20, and 21, 22 and 30.

Each pin has associated with it a respective screen 1A, 2A, 3A . . . , and these screens are all connected electrically together and thence to ground by means of a line 174.

The system also includes thirty high speed switches (HSS), one for each contact pin. The HSS are numbered 41 to 70 and each has a respective output line A which connects it to its respective contact pin; in the drawing, only the HSS 41, 42 and 50, 51, 52 and 60, and 61, 62 and 70, are illustrated, together with their respective output lines.

The ten contact pins 1 to 10 of the first group are also connected via respective relay contact pairs 101 to 110 to ten lines 71 to 80. As shown, the contact pins 11 to 20 of the second group of pins are also respectively connected to the output lines 71 to 80, in parallel with the contact pins 1 to 10 of the first group, via respective relay contact pairs 111 to 120.

Similarly, the contact pins 21 to 30 are respectively connected to the output lines 71 to 80, in parallel with the contact pins 1 to 10 and the contact pins 11 to 20, via respective relay contact pairs 121 to 130.

The lines 71 to 80 are respectively connectable by means of a selector switch 150 to a line 152 which connects to the central control unit 154 of the system. The switch 150 is set to any particular state by means of setting signals received on a line 155 from the unit 154. The switch 150 may in fact comprise respective pairs of relay contacts between each of the lines 71 and 80 and the single line 152, a particular one of the relay contact pairs being closed (under control of the setting signals on line 155) in order to determine which of the output lines 71 to 80 is connected to the single line 152.

The relay contact pairs 101 to 110, 111 to 120, and 121 to 130 are controlled by a control circuit 160. This circuit comprises three transistors 162, 164 and 166 in each of whose collector circuits is connected a respective relay coil 168, 170 and 172. The collector circuits of the transistors are connected in common to the ground line 174, while their emitters are connected to a positive supply line 176. Each transistor may be rendered conductive by a setting signal applied to its base via a respective pin 178, 180 and 182 and via respective diodes 184 and resistors 186, and when so rendered conductive the transistor energises its respective relay coil. Energisation of relay coil 168 closes the contact pairs 101 to 110; energisation of relay coil 170 closes relay contact pairs 111 to 120; and energisation of relay coil 172 closes relay contact pairs 121 to 130. The lines 178, 180 and 182 are controlled by the central control unit 154 but their connections to unit 154 have been omitted for clarity.

The HSS will be described in detail below. However, each has a respective pair of enabling lines B and C. The enabling lines B and C of all the HSS are connected individually to the central control unit 154 by means of connections which have been omitted from the drawing for clarity.

In addition, all the HSS are connected to a common control line D which is fed from a pulsed voltage source 270 in the central control unit 154. Finally, the HSS are all connected in common via unit 271 to lines E, F and G which are fed from a voltage supply source 272 to be described in detail below. The source 272 is controlled by the control unit 154 via line 273 and holds line E at the level of a binary HIGH signal for the logic circuit to be tested (which may, for example, be between +3 volts and +30 volts depending on the type of logic involved). Line F is connected to the ground line 174, while line G is held at, say, +5 volts.

When the enabling line B of an HSS is ON (and enabling line C OFF), then the respective output line A goes to the binary HIGH level of line E when, and for so long as, the control line D is pulsed ON by the pulse source 270. When the control line D goes OFF, the output line A reverts to a floating level, at which it can assume a potential as determined by the logic circuit under test (in other words, it does not affect the logic circuit under test).

When the enabling line B is OFF and the enabling line C is ON instead, then the output line A of the HSS is switched to the binary LOW level of line F when and for so long as the control line D is pulsed ON by the pulse source 270. When the control line D goes OFF again, then the output line A reverts to the floating level mentioned above.

When neither of the enabling lines B and C is ON, then the output line of the HSS is continuously unaffected by pulsing of the line D and remains at a floating level.

In this way, the central control unit 154 can set up each of the HSS individually, by applying appropriate ON and OFF signals to their enabling lines B and C, so that, when the control line D is pulsed ON, the output lines A of the HSS apply desired binary levels to their corresponding contact pins 1 to 30.

The pulse source 270 may be arranged so as to provide ON pulses having a length of, say, 10 uS.

In this way, the HSS can apply binary input levels to various parts of the logic circuit under test.

In operation, not all the contact pins 1 to 30 would be used to supply binary input signals to the logic circuit under test; at least one contact pin would be used to feed out the resultant binary output signal from the logic circuit to the central control unit 154 for determining whether or not the logic circuit is operating correctly. The HSS of this contact pin would therefore not be enabled by its lines B and C. Instead, this contact pin would be selected (via lines 178, 180 and 182) by energising the particular relay coil 168, 170 and 172 corresponding to the particular group of ten contact pins in which the particular contact pin lies, so as to connect that particular contact pin to its respective one of the output lines 71 to 80, and then selecting (via line 155) that particular output line by means of the selector switch 150 as to connect it, by means of the single line 152, to the central control unit 154.

Figure 2:
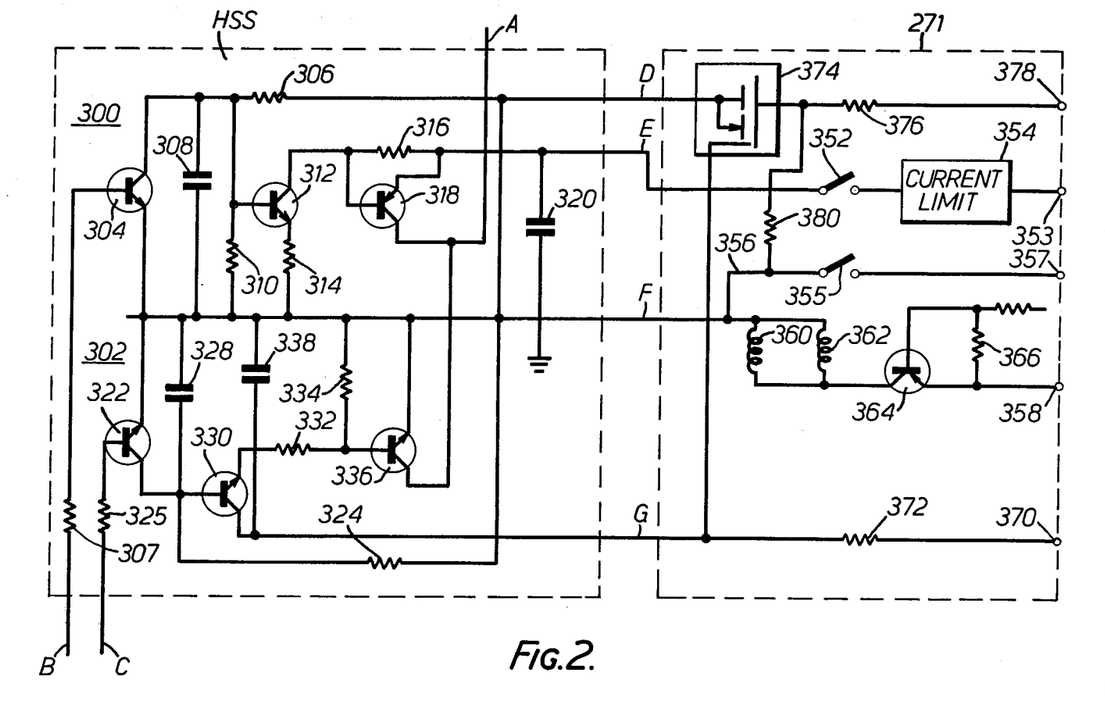
FIG. 2 is a schematic circuit diagram of electronic high speed switches which are used in the apparatus and shown in block form in FIG. 1.

The circuit diagram of one of the HSS will now be described in more detail with reference to FIG. 2; the remaining HSS have identical circuits. FIG. 2 also shows, connected to the HSS, the circuit diagram of the connection unit 271; there is only one such connection unit which is connected to all the HSS in parallel and connects them to the pulse source 270, the voltage source 272 and the central control unit 154.

The HSS comprises a section 300 which is controlled by the enabling line B and determines whether the output line A of the HSS goes to binary HIGH when the line D is momentarily pulsed from negative to positive voltage (according to whether the enabling line B is ON or OFF), and a section 302 which is controlled by the enabling line C and determines whether the output line A goes to binary LOW when the line D is momentarily pulsed from negative to positive (according to whether the enabline line C is ON or OFF).

Section 300 comprises an npn transistor 304 whose emitter-collector path is connected between the line D and the line F via a resistor 306. The base of this transistor is connected to the enabling line B via a resistor 307. Transistor 304 has a capacitor 308 connected across it together with a resistor 310, and the base-emitter path of an npn transistor is connected across resistor 310 via a resistor 314. The collector of transistor 312 is connected to the line E via a resistor 316, across which is connected the base-emitter path of an output transistor 318 whose collector is connected to the output line A of the HSS. A large capacitor 320 is connected between lines E and F.

The section 302 comprises an npn transistor 322 whose emitter-collector path is connected between lines D and F via a resistor 324, and the base of this transistor is connected to the line C via a resistor 325. A capacitor 328 is connected across transistor 322, and the base-emitter path of a further transistor 330 is connected across this capacitor via resistors 332 and 334. The collector of transistor 330 is connected to the line G. The base of an output transistor 336 is connected to the junction between resistors 332 and 334, and the emitter of this transistor is connected to line F. Its collector is connected to the output line A of the HSS. A capacitor 338 is connected between line G and line F.

In operation, line D is normally at zero volts, and, when both of the enabling lines B and C are OFF, each is held relatively positive so that both transistors 304 and 322 are conductive. In the section 300, therefore, transistors 312 and 318 are non-conductive, and in the section 302 transistors 330 and 336 are likewise non-conductive. The output line A is therefore at a floating potential which is determined by the conditions in the logic circuit under test.

When line D is pulsed momentarily positive, conditions in the HSS do not change, because the conducting transistors 304 and 322 hold the bases of transistors 312 and 330 at zero volts.

However, when the enabling line B is ON (and enabling line C is OFF), line B is at zero volts, and therefore transistor 304 becomes non-conductive. For so long as line D remains at zero volts transistors 312 and 318 remain non-conductive and the output line A therefore remains at the floating level. However, when line D is momentarily pulsed relatively positive, transistor 312 conducts and switches on transistor 319 which therefore connects the output line A to the binary HIGH logic level of the line E. At the end of the pulse on line D, transistors 312 and 318 switch off again, and line A once more reverts to the floating level.

If the enabling line C is ON (and enabling line B is OFF) instead, then line C is held at zero volts and transistor 322 is switched off. Again, for so long as line D remains at zero volts, transistors 330 and 336 remain non-conductive and line A remains at the floating level. However, when line D goes momentarily positive, transistor 330 conducts and switches on the transistor 336, which therefore switches the output line A to the binary LOW level of line F.

In the connection unit 271, line E is connected to the voltage source 272 via a pair of relay contacts 352, terminals 353, and current limiting means 354 of any suitable form.

Line F is connected to the voltage source 272 via a relay contact pair 355, a line 356 and a terminal 357. Line 356 is connected to a terminal 358 via two parallel-connected relay coils 360 and 362, and the emitter-collector path of a transistor 364, the base-emitter path of transistor 364 being connected across a resistor 366. Relay coil 360 controls the contact pair 352, while relay coil 362 controls the contact pair 355.

Line G is connected to a +5 volt supply of source 272 via terminal 370 and a resistor 372, and this resistor also supplies a field effect transistor 374 whose source is connected to the line D and whose gate is controlled via a resistor 376 and a terminal 378 connected to the pulse source 270.

When the system is switched on, a zero volt level at terminal 358 causes transistor 364 to conduct, thus energising the relay coils 360 and 362. Relay contact pairs 352 and 355 conduct, and line F therefore becomes connected to the voltage source through contacts 355 and terminal 357. Similarly, relay contact pair 352 connects line E to the logic level (for example, between +3 volts and +30 volts) determined by the central control unit 154 in accordance with the type of logic of the logic circuit under test. The current limiting means 354 prevents too large a current when the system is initially switched on and charging current flows into the large capacitors of each HSS. Line G is permanently connected to a positive level via resistor 372.

Terminal 378 is normally held at such level by the pulse source 270 that the FET 374 is non-conductive and line D is therefore held at zero volts. However, when the pulse source 270 momentarily pulses terminal 378, the FET conducts and line D goes relatively positive.

A large resistor 380 is connected between line 356 and the gate of the FET 374 so as to hold line D at zero volts should the terminal 378 be inadvertently disconnected.

Figure 3:
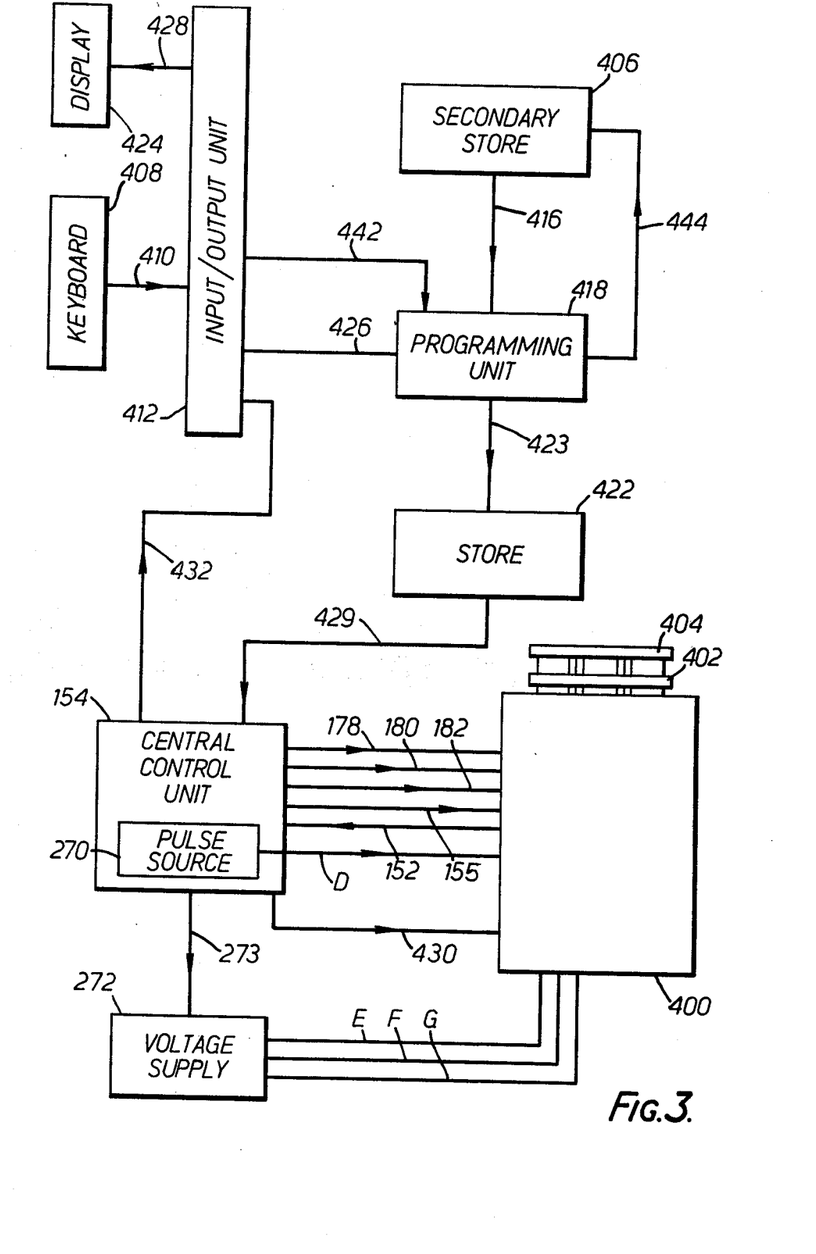
FIG. 3 is a block circuit diagram of the complete apparatus.

FIG. 3 shows, diagrammatically, how the central control unit 154 is itself controlled in accordance either with pre-stored test information corresponding to one of a plurality of different predetermined logic circuit types, or, where a logic circuit to be tested is not one of the plurality, in accordance with instructions from the operator. In the latter case, in a manner to be described, the instructions fed in by the operator are arranged to be stored and identified so that they can be called up again when that particular type of logic circuit is next to be tested, merely by identifying that logic circuit.

In FIG. 3, items corresponding to items in FIGS. 1 and 2 are correspondingly reference. The circuitry comprising the HSS, their output lines A, the lines 71 to 80, and the selector switch 150 is shown in a single block 400, while the contact plate bearing the contact pins 1 to 30 is represented by block 402 and a circuit board including the logic circuit to be tested is represented by block 404.

The system includes a store 406 which stores test information relating to a plurality of different predetermined types of logic circuit. Thus, for each of the logic circuits, it stores information which defines the binary output level (or levels) which should be produced on one (or more) terminals if the logic circuit is operating correctly for each of a plurality of different predetermined binary input levels on other terminals of the logic circuit. The terminals are identified by serial numbers (e.g. numbers 1-14) in accordance with standard numbering.

The operator is then provided with a keyboard 408 by means of which he may generate a test programme for the logic circuit, or combination of logic circuits, by defining the type numbers of the logic circuits. Signals representing these type numbers are then fed to the programming unit 418 by means of a channel 410, an input/output unit 412 and a channel 442.

When the operator has fed in the type number of the logic circuit to be tested, he then has to feed in connection information to identify the particular contact pins on the contact plate 402 which correspond to the terminals of the particular logic circuit that he wishes to test on the circuit board 404. For example, if the logic circuit to be tested is of a type which has fourteen terminals numbers 1 to 14, and these terminals happen to be so physically positioned on the circuit board 404 as to be respectively contacted by contact pins 2, 4, 5, 6, 7, 12, 15, 17, 18, 23, 26, 27, 28, and 30, the operator would use the keyboard 408 to insert, sequentially, these fourteen numbers in that order. Signals corresponding to these numbers are fed by means of the channel 410, the input/output unit 412 and a channel 442 to the programming unit 418.

The programming unit 418 then compares the type number of the logic circuit with the plurality of logic circuits for which test information is stored in the store 406, and then using the predetermined test information stored on the store 406 and the connection information provided by the operator, it feeds out the information in terms of the appropriate contact pins on the contact plate 402 instead of in terms of the actual terminal numbers of the logic circuit. Therefore, the programming unit produces, for that logic circuit, a sequence of test patterns, each test pattern comprising information defining the binary levels which are to be applied to certain of the contact pins 1 to 30 on the contact plate 402 (via the HSS) and the binary output level that should be produced on another one (at least) of the contact pins 1 to 30 if the logic circuit is not faulty. These sequences are fed to the store 422 on channel 423.

A display unit 424 is provided, and by means of this, and channels 426 and 428, the programming unit 418 may signal to the operator that the logic circuit which the user wishes to test, and which he has identified on the keyboard 408, is in fact the logic circuit for which test information is already in the store and that the test sequence has been generated and stored.

Testing can now be carried out under control of the information stored in the store 422. Under control of channel 429 the central control unit 154 energises appropriate ones of the enabling lines B and C, which are shown connected between the central control unit 154 and the block 400 by a channel 430, and then energises an appropriate one of the control lines 178, 180 and 182, and so sets the selector switch 150 by means of the line 155, that the particular one of the lines 71 to 80 which is connected to the contact pin on the contact plate 402 where the binary output is to be produced is connected back to the central control unit 154 by means of the line 152.

The central control unit 154 then energises the control line D by means of the pulse source 270, and the appropriate binary logic levels are fed to the appropriate contact pins 1 to 30 via the enabled HSS as previously explained. The binary output level resulting from this is then fed back to the central control unit 154 on the line 152 and is compared with the level that should be produced if the logic circuit is not faulty, this level being fed to the central control unit 154 by the store 422.

The foregoing assumes that the store 406 is storing the test information for the particular logic circuit to be tested and identified by the operator on the keyboard 408—in other words, that the store 406 is storing the Truth Table for that logic circuit. If the store 406 is storing no information about that logic circuit, then the operator has to feed in the Truth Table in a manner now to be described.

If the logic circuit to be tested and which is identified by the operator by means of the keyboard 408 is not one that is contained in the store 406, the programming unit 418 will signify this to the operator by means of channel 426, input/output unit 412, channel 428 and the display unit 424. In such circumstances, therefore, the programming unit will request the operator to use the keyboard 408 to enter the basic test information relating to the testing to be carried out on the logic circuit, and the keyboard enters this information into the programming unit 418 by means of a channel 410, the input/output unit 412, and a channel 442; this information will be in terms of the input and output binary signal to be applied to and produced from the various terminals of the logic circuit without reference to the particular contact pins to which they happen to be connected on the particular circuit board 404 under test. This basic test information is then fed by the programming unit 418 to the store 406 by means of channel 444 and is stored in the store 406 so as to be available immediately that particular logic circuit has to be tested at any time in the future. The operator will then enter (by means of the keyboard 408 and the line 410) connection information (corresponding to that entered as described above when the store 406 already knows the logic circuit under test) relating the actual terminals of the logic circuit to the particular contact pins 1 to 30 of the contact plate 402.

In response to this information, the programming unit 418 therefore generates the required test patterns identifying the binary signals to be applied to and to be expected from various contact pins of the plate, and this information is stored in the store 422. The central control unit 154 is then able to carry out the testing as described above.

The system may also be arranged so that, as an alternative to the operator entering into the programming unit 418 the actual test sequences to be carried out on a logic circuit for which information has not previously been stored in the store 406, he simply feeds in information describing the logic circuit under test in the form of basic logic elements (AND, OR, NAND gates and the like). In such a case, information relating to such standard logic elements is fed from the store 406 into the programming unit 418, together with the operator's information, so as to allow the programming unit 418 to build up the test sequences as previously.

The process by which the operator feeds into the system information relating to the testing of a logic circuit for which information is not already stored in the store 406, may be interactive, that is to say, the programming unit 418 and the store 406 may be arranged to display (on the display unit 424) information relating to the progress of this process so as to guide the operator during the process.

The system may instead be arranged so that, as an alternative to the store 422 being connected to the central control unit 154, the store 422 can be a removable store such as a magnetic disc or tape. The operator would then operate the keyboard in the manner explained, so as to set up the test sequences in the store 422. However, as this store is not connected to the central unit 154, no direct control takes place. Instead the operator is able to remove the record medium bearing the stored test sequences from the store 422, and then take it to a suitable drive unit associated with the central control unit 154 as to drive the latter. By this means, test programs can be generated by the programming circuit 418 and transferred to the central control unit 154 and used at some later date. Also the test program set up in the store 422 can be copied and used by several different central control units associated with different apparatus.

Although the foregoing description has referred primarily to the testing of logic circuits, it will be appreciated that this system can also be used to test electrical components such as resistors and capacitors, and the operation would be broadly as described, the store 406 being arranged to pre-store information relating to the input and output signal levels to be applied to and across such components in order to test them for correctness of value.

What is claimed is:

1. Apparatus for the automatic testing of electrical and electronic circuitry, comprising
    a base member,
    a plurality of contact means mounted in predetermined physical relationship with each other on the base member for making respective and simultaneous contact with predetermined terminals on a circuit to be tested,
    a plurality of switching means each connected to a respective one of the contact means and being selectively operable to enable test signals to be applied to at least some predetermined ones of the terminals via the respective contact means and to enable a resultant output signal from at least one predetermined one of the terminals to be picked up by the respective contact means,
    test circuit means connected to the switching means for simultaneously applying the test signals to the predetermined ones of the terminals via the selectively operated switching means for a predetermined length of time which is insufficient in relation to the magnitude of the test signals to cause damage to other circuits which may be connected to the terminals of the circuit under test, and
    means connected to the switching means for monitoring the or each resultant output signal to determine whether the circuit under test is operating correctly or not.

2. Apparatus according to claim 1, in which the switching means comprise a respective switching element in circuit with each contact means; and in which the test circuit means comprises
    means for individually setting each switching element into an operative condition or an inoperative condition, and
    means for subsequently pulsing all of the switching elements for the predetermined length of time whereby to apply the said test signals to all of the contact means whose switching elements have been set into the operative condition but not to apply test signals to those contact means whose switching elements have not been set into the operative condition.

3. Apparatus according to claim 2, in which the operative condition of each switching element comprises a selected one of two possible operating states, whereby when the switching elements are pulsed those switching elements which are in one operating state apply a test signal of one binary type to their contact means and those switching elements which are in the other operating state apply test signals of the other binary type to their contact means.

4. Apparatus according to claim 1, including
    storage means for storing for each of a plurality of separately identifiable circuits to be tested, or separately identifiable parts to be tested of circuitry, test information defining a respective pattern of test signals to be applied to predetermined terminals of that circuit or part and the resultant output which should be produced at one or more predetermined terminals of the circuit or part if it is operating correctly,
    first input means responsive to information identifying a particular circuit or part of circuitry to be tested to generate corresponding identifying signals, means responsive to the identifying signals and connected to the storage means for feeding the said test information relating to the identified particular circuit or part out of the storage means, second input means operable to generate connection information correlating the particular predetermined terminals of the said identified circuit or part of circuitry with the particular contact means to which those terminals are temporarily connected, and programming means connected to be responsive to the fed-out test information and the connection information and connected to the test circuit means so as to set the test circuit means to operate accordingly.

5. Apparatus for the automatic testing of electrical and electronic circuitry comprising:

a plurality of contact means mounted in predetermined physical relationship with each other for making electrical contact with predetermined terminals of circuitry to be tested;

a first plurality of switching elements each connected to a respective one of the contact means and each capable of being set into a first state or a second state by means of enabling signals;

means for energising the switching elements;

means for simultaneously applying control signals for a predetermined time period to all the switching elements in common whereby each switching element in the first state feeds a test signal of first predetermined level to its corresponding contact means for the predetermined time period and each switching element in the second state feeds a test signal of second predetermined level to its corresponding contact means for the predetermined time period;

the predetermined time period being such, in relation to the said predetermined levels, that the test signals applied to the circuitry do not damage the components thereof;

each switching element not in the first or second state not affecting its corresponding contact means;

a second plurality of switching elements interconnected with the contact means and settable by means of setting signals to select at least one of the contact means; and control means for generating the enabling signals and the setting signals in accordance with information relating to a particular part to be tested of the circuitry whereby to apply one or more of the test signals at respective said predetermined levels to predetermined ones of the terminals of that part of the circuitry and to measure any resultant signal produced by that part of the circuitry under test at the contact means selected by the second switching elements, so as to assess whether the operation of that part of the circuitry is faulty or not.

6. Apparatus according to claim 5, in which the switching elements of at least the first plurality are electronic switching elements.

7. Apparatus according to claim 5, in which the switching elements of the second plurality are electromechanical relays.

8. Apparatus according to claim 5 or 6, in which the switching elements of the second plurality comprise at least two groups of switching elements;

each switching element of a first one of these groups connecting a respective one of a first group of the contact means with a respective one of a plurality of lines corresponding in number to the number of switching elements and contact means in the first group, and each switching element of the second group connecting a respective one of a second group of the contact means to a respective one of the said lines, and a further switching element for selecting any particular one of the said lines;

the switching elements of the first group being ganged for operation together and the switching elements of the second group being ganged for operation together;

whereby any particular one of the contact means can be selected by the setting signals by operating the switching elements of the particular group associated with the group of the contact means in which the particular contact means lies, so as to connect that particular contact means to its respective one of the said lines, and operating the further switching element to select that particular one of the lines.

9. Apparatus according to claim 5, including storage means for storing for each of a plurality of separately identifiable circuits to be tested, or separately identifiable parts to be tested of circuitry, test information defining a respective pattern of test signals to be applied to predetermined terminals of that circuit or part and the resultant output which should be produced at one or more predetermined terminals of the circuit or part if it is operating correctly, first input means responsive to information identifying a particular circuit or part of circuitry to be tested to generate corresponding identifying signals, means responsive to the identifying signals and connected to the storage means for feeding the said test information relating to the identified particular circuit or part out of the storage means, second input means operable to generate connection information correlating the particular predetermined terminals of the said identified circuit or part of circuitry with the particular contact means to which those terminals are temporarily connected, and programming means connected to be responsive to the fed-out test information and the connection information and connected to the control means so as to set the control means to operate accordingly.

10. Apparatus according to claim 9, including third input means operable to generate test information relating to a circuit or part of circuitry to be tested for which test information is not stored in the storage means, means responsive to the test information generated by the third input means to enter that information into the programming means whereby the programming means responds to that test information and to connection information relating to the corresponding circuit or part and produced by the second input means so as to set the control means to operate accordingly, and means responsive to the test information generated by the third input means for feeding into the storage means that test information and identifying it as relating to the particular circuit or part of circuitry so as to enable it to be read out when that circuit or part is next to be tested.

11. A method of automatically testing a logic circuit while it is interconnected in a circuit arrangement with other logic circuits, comprising the steps of
simultaneously applying test signals of predetermined value directly to preselected ones of the terminals of the logic circuit under test for a predetermined length of time which is insufficient in relation to the values of the test signals to cause damage to the other logic circuits, and
monitoring the resultant output signal produced at at least one other of the terminals of the logic circuit in relation to the test signals applied to the logic circuit whereby to assess whether the logic circuit is operating correctly or not.

12. Apparatus for the automatic testing of electrical and electronic circuitry, comprising:
a base member;
a plurality of contact means mounted on the base member in predetermined physical relationship with each other for making respective and simultaneous contact with predetermined terminals of a circuit to be tested;
control means operative in response to predetermined test information respective to the circuit to be tested to apply predetermined test signals to selected ones of the predetermined terminals via the respective contact means and to monitor the value of a resultant output signal produced from a selected one or more of the predetermined terminals via its respective contact means whereby to determine whether the circuit is operating correctly or not;
storage means for storing, for each of a plurality of separately identifiable circuits to be tested, test information defining the predetermined terminals of that circuit to which test signals are to be applied and the resultant output signal which should be produced at one or more predetermined terminals of the circuit if it is operating correctly;
first input means responsive to the identity of a particular circuit to be tested and generating identifying signals identifying that particular circuit;
means responsive to the identifying signals and connected to the storage means for feeding the said test information relating to that particular circuit out of the storage means if it is stored therein;
second input means operable to produce connection information correlating the particular predetermined terminals of the particular circuit to be tested with the particular contact means to which those terminals are temporarily connected;
third input means operable to generate test information relating to the particular circuit to be tested when that test information is not stored in the storage means;
programming means connected to receive the test information relating to the said particular circuit from the storage means or the generating means and to receive the said connection information, and connected to the control means so as to render the control means operative in dependence on that test information and that connection information; and
means connected to the third input means and the storage means for feeding into the storage means the test information produced by the third input means and identifying it in the storage means as relating to the said particular circuit so as to enable it to be read out when that circuit is next to be tested.

* * * * *